United States Patent [19]

Zens

[11] 4,398,149
[45] Aug. 9, 1983

[54] NMR PROBE COIL SYSTEM

[75] Inventor: Albert P. Zens, Santa Clara, Calif.

[73] Assignee: Varian Associates, Inc., Palo Alto, Calif.

[21] Appl. No.: 230,226

[22] Filed: Feb. 2, 1981

[51] Int. Cl.³ ............................................. G01R 33/08
[52] U.S. Cl. .................................. 324/319; 324/300; 324/316
[58] Field of Search ............... 324/300, 307, 318, 316, 324/319, 320, 322, 321

[56] References Cited

U.S. PATENT DOCUMENTS 2,830,212  4/1958  Hanlet ................................. 324/300
3,701,959 10/1972  Hansen ............................... 324/316

Primary Examiner—Michael J. Tokar
Attorney, Agent, or Firm—Stanley Z. Cole; E. H. Berkowitz

[57] ABSTRACT

A saddle coil for operation in the probe of an NMR spectrometer is formed from coil portions of opposite helicities disposed on a flexible insulating material, the outer windings of said portions connected by a linking conductor disposed on said insulating medium, which medium is then deformed to form a cylindrical body.

4 Claims, 3 Drawing Figures

NMR PROBE COIL SYSTEM

DESCRIPTION

FIELD OF THE INVENTION

The present invention pertains to structure employed within the probe of an NMR spectrometer and more particularly to the coil for coupling the spectrometer to a sample.

BACKGROUND OF THE INVENTION

The probe of an NMR spectrometer serves the function of containing the sample within a uniform polarizing magnetic field, providing the means to couple the RF excitation radiation to the resonators of the sample and to couple the resonant excitation from the resonators of the sample to an RF receiver. The probe may also support sample temperature monitoring means, a turbine to spin the sample, and additional functions such as spin decoupling and field frequency lock stabilization. Dimensional constraints are imposed upon the probe because of its position within a relatively narrow gap between the poles of a magnet or within a superconductive solenoid, in order to minimize any inhomogenities of the polarizing magnetic field which would affect the precision of the resulting measurements. The external dimensional constraint is compounded by internal constraints arising from the multiplicity of probe contained apparatus.

The sensitivity of the spectrometer depends to a very large extent upon the efficient RF coupling of the reservoir coil to the resonators of the sample. In certain situations it is desirable for this coil to take the form of a saddle coil for defining and surrounding an interior volume, usually cylindrical in which the sample is housed. Saddle coils in NMR probe apparatus are discussed by Hoult, *Experimental $^{13}C$ Spectroscopy*, Vol. III, G. C. Levy, ed., Wiley Interscience (1979). Sensitivity is related to the number of radiating resonators, e.g., the volume and density of the sample within the receiver coil of the probe. The magnitude of the sample volume is limited by the homogeneity of the polarizing field over the volume element defined by the receiver coil. For a fixed volume element it is therefore desirable to assure that the entire interior volume of the saddle coil be available for sample material.

An object of the present invention is an improved form of NMR probe coil exhibiting particular improvement in the manufacture thereof.

In one feature of the present invention, the coil comprises a pair of spiral windings, said windings of opposite helicity and symmetrically disposed about an axis, the outer portions of the respective spiral windings electrically connected in series.

In another feature of the invention the series connection between the pair of spiral windings is wholly on the surface defined by said spiral windings.

In yet another feature of the present invention, the surface defined by the spiral windings is a cylinder.

In another feature of the present invention, the spiral windings comprise printed circuit portions supported on a flexible insulating medium.

In yet another feature of the invention the flexible medium supporting the coil portions is supported in the interior of a hollow cylindrical coil form.

DETAILED DESCRIPTION OF THE PRESENT INVENTION

Figures 1, 2, 3:
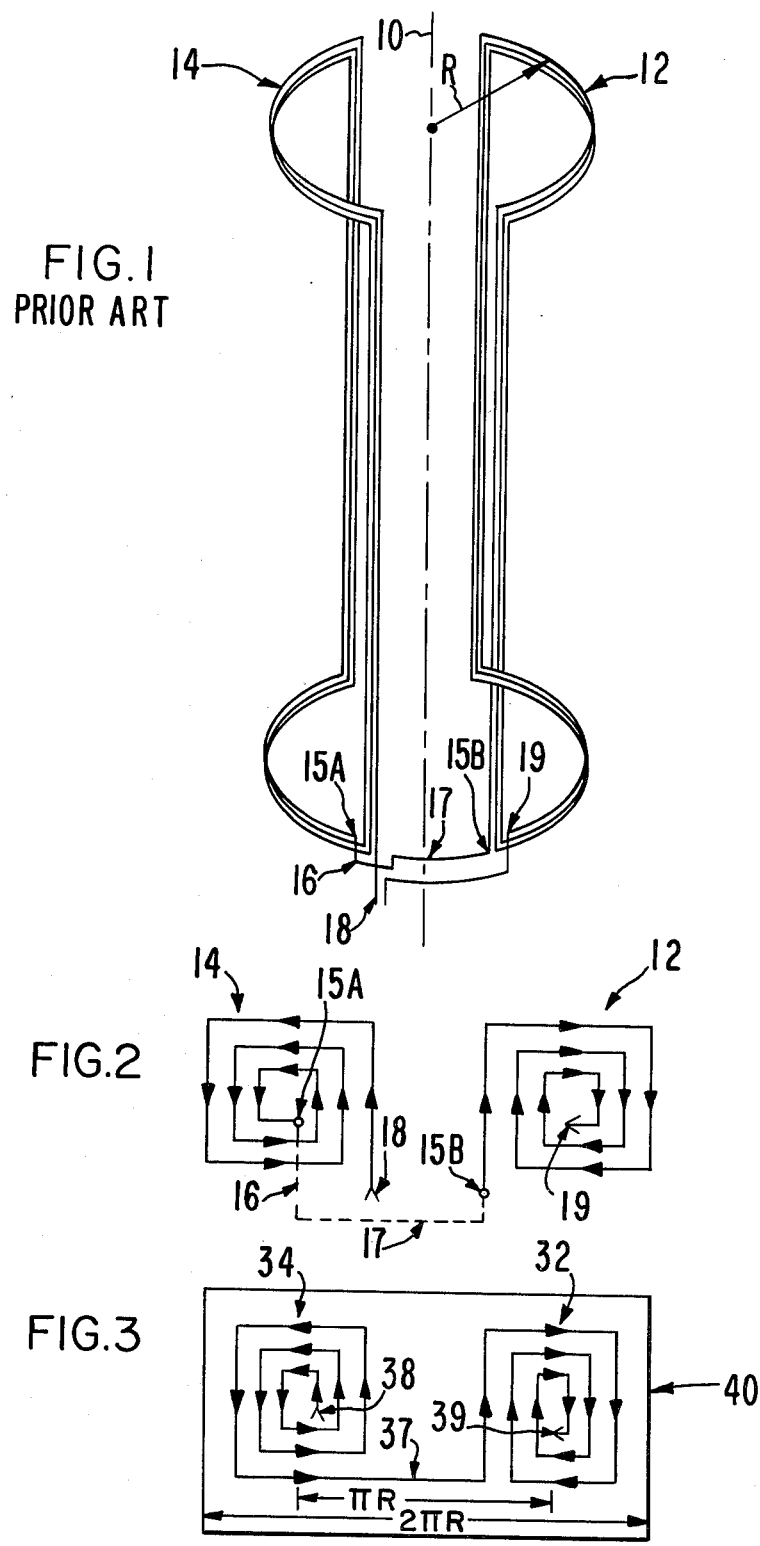
FIG. 1 is a prior art saddle coil.
FIG. 2 is a representation of the saddle coil of FIG. 1.
FIG. 3 is a representation of the saddle coil circuit configuration in the present invention.

A prior art saddle coil of radius R is shown in FIG. 1. Two square spiral wound coil portions 12 and 14, of opposite helicities, are symmetrically arranged about an axis 10 to define a cylindrical volume therebetween. The inner terminal 15a of winding portion 14 must bridge at 16 windings of portion 14 to connect through connecting link 17 to the outer terminal 15b of portion 12. Terminals 18 and 19 are the external terminals of the series combination forming the complete saddle coil. (The present invention concerns the disposition and connection of the internal terminals.) For convenience, this prior art arrangement is shown in FIG. 2 mapped on to a plane, where only a few turns are shown.

In FIG. 3 there is shown a representation of the receiver coil of the present invention. Again, there are two respective winding portions 32 and 34 exhibiting opposite helicities. However, one notes that there is no bridge required for the series link 37 between the winding portions 32, 34. Terminals 38 and 39 are the external terminals of the saddle coil. These are the only external connections required.

In a practical realization of the saddle coil of the present invention, the coil portions and connecting link are printed by standard techniques on a suitable flexible insulating material 40. A printed circuit realization of the invention is preferred because of the greater precision obtained for the geometrical properties of the resulting coil. Alternatively the coil portion may be stamped from a flat piece of metal and formed to a cylindrical, or other desired shape. These processes are well known and outside the scope of the present invention. The external terminals of the coil are accessed through the back of the insulating substrate of the printed coil or similar insulating support. It is noted that the prior art saddle coil of FIG. 1 exhibits two bridges, the second accommodating external terminal 19. The latter bridge is utilized to provide for an antiparallel conducting path to link 17 in order to reduce asymetries owing to the presence of link 17. In like manner an antiparallel conducting path to series link 37 is obtainable from an external conductor communicating with an external terminal of the present invention.

Several beneficial results attend the configuration of the present invention. First, the interior space of the coil is totally available to a sample, thus obtaining a maximum filling factor. This would not be the case if the bridge were accommodated on the inside surface defined by the saddle coil because the bridging conductor would intrude to some degree upon the interior volume of the saddle coil, reducing the sample volume. The present invention is preferentially accommodated within the interior of a cylindrical coil-forming surface of radius R in straightforward manner with access through the coil-forming surface for the external communicating terminals 38 and 39. Another benefit of the present invention is the reduction of the manufacturing steps required for the construction of the coil of the present invention.

While the invention has been described in detail with respect to a particular embodiment such as realization by printed circuit techniques, it will be understood by those skilled in the art after understanding the invention, that various changes in modifications could be made without departing from the spirit of the scope of the invention. For example, a saddle coil can be configured directly from rigid conductors formed and shaped by any suitable method and then mounted with respect to suitable support. It is intended, therefore, to cover all such changes and modifications in the appended claims.

In comparison to prior art saddle coils of like dimensions it has been found that the Q of the saddle coil of the present invention is consistently somewhat higher. This is believed to follow from the absence of a bridging conductor for the series link. Distributed reactances are therefore reduced in the present invention as compared to the prior art and this is reflected in the respective values of Q for otherwise similar saddle coils.

What is claimed is:

1. An NMR spectrometer comprising polarizing means for aligning nuclear moments of a sample, means for exciting rf resonances in said sample, receiver means for detecting said resonances, probe means communicating with said receiver means for coupling said resonance signal from said sample to said receiver, said probe means comprising saddle coil means comprising a first spiral winding portion and a second spiral winding portion, said second spiral winding portion wound in opposite sense to said first winding portion, the outer ends of said winding portions connected by a linking conductor, said winding portions capable of dispositions spaced apart in a common plane, said connecting link constrained to said plane.

2. The apparatus of claim 1 wherein the centers of said spiral portions are spaced apart by an amount $\pi R$ in a plane whereby said planar disposed winding portions may be formed as a cylinder of radius R.

3. The apparatus of claim 2 wherein said coil portions comprise conductors disposed on a flexible insulating material.

4. The apparatus of claim 2 wherein said coil portions comprise self-supporting conductive members.

* * * * *